United States Patent
Barth, Jr. et al.

(10) Patent No.: US 8,605,528 B2
(45) Date of Patent: Dec. 10, 2013

(54) SENSE AMPLIFIER HAVING AN ISOLATED PRE-CHARGE ARCHITECTURE, A MEMORY CIRCUIT INCORPORATING SUCH A SENSE AMPLIFIER AND ASSOCIATED METHODS

(75) Inventors: John E. Barth, Jr., Williston, VT (US); Donald W. Plass, Poughkeepsie, NY (US); Adis Vehabovic, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 13/288,424

(22) Filed: Nov. 3, 2011

(65) Prior Publication Data

US 2013/0114361 A1    May 9, 2013

(51) Int. Cl.
 *G11C 7/00* (2006.01)
(52) U.S. Cl.
 USPC ............................ 365/205; 365/203; 365/207
(58) Field of Classification Search
 USPC .................................. 365/205, 207, 149, 203
 See application file for complete search history.

(56) References Cited

U.S. PATENT DOCUMENTS

| | | | |
|---|---|---|---|
| 3,764,906 A | 10/1973 | Heller | |
| 4,010,453 A | 3/1977 | Lewis | |
| 4,625,300 A | 11/1986 | McElroy | |
| 4,716,320 A | 12/1987 | McAdams | |
| 4,831,287 A | 5/1989 | Golab | |
| 5,013,943 A | 5/1991 | Hirose | |
| 5,339,274 A | 8/1994 | Dhong et al. | |
| 5,619,149 A | 4/1997 | Lev et al. | |
| 5,748,015 A | 5/1998 | Tam | |
| 6,297,670 B1 | 10/2001 | Chao et al. | |
| 6,345,006 B1 | 2/2002 | Ingalls et al. | |
| 6,370,072 B1 | 4/2002 | Dennard et al. | |
| 6,438,051 B1 | 8/2002 | Fifield et al. | |
| 6,466,497 B1 | 10/2002 | Desai et al. | |
| 6,608,787 B1 | 8/2003 | Daga et al. | |
| 6,678,198 B2 | 1/2004 | Issa et al. | |
| 6,738,300 B2 | 5/2004 | Barth, Jr. | |
| 7,082,076 B2 | 7/2006 | Terzioglu et al. | |
| 7,099,216 B2 | 8/2006 | Luk et al. | |
| 7,286,425 B2 | 10/2007 | Barth, Jr. | |
| 7,508,707 B2 * | 3/2009 | Nakai et al. | ............. 365/185.08 |
| 7,545,180 B2 | 6/2009 | Goel et al. | |
| 7,692,990 B2 | 4/2010 | Barth, Jr. | |
| 7,768,321 B2 | 8/2010 | Chang et al. | |
| 7,869,294 B2 | 1/2011 | Kajigaya et al. | |
| 7,933,141 B2 | 4/2011 | Kajigaya et al. | |

(Continued)

*Primary Examiner* — Huan Hoang
(74) *Attorney, Agent, or Firm* — Gibb & Riley, LLC; David A. Cain, Esq.

(57) ABSTRACT

Disclosed are a sense amplifier and a memory circuit that incorporates it. The amplifier comprises cross-coupled inverters, each with a pull-down transistor and a pull-up transistor connected in series. One inverter has a voltage-controlled switch controlling the electrical connection between drain nodes of the transistors. During a read operation, the pull-up transistor drain node is pre-charged high and the pull-down transistor drain node receives an input signal. The switch is tripped, thereby making the electrical connection only when the voltage at the pull-down transistor drain node is less than the switch's trip voltage. In this case, the sense node discharges to the same level as the input signal. Otherwise, the switch prevents the electrical connection and the sense node remains high. The trip voltage depends on a reference voltage, which can be variable, thereby allowing the sensitivity of the sense amplifier to be selectively adjusted. Also disclosed are associated methods.

20 Claims, 4 Drawing Sheets

(56) References Cited

U.S. PATENT DOCUMENTS

| | | | |
|---|---|---|---|
| 2003/0128055 A1* | 7/2003 | Lin et al. ..................... 327/57 |
| 2010/0061158 A1 | 3/2010 | Kim et al. |
| 2010/0124089 A1 | 5/2010 | Ali et al. |
| 2010/0157698 A1 | 6/2010 | Barth, Jr. |

* cited by examiner

SENSE AMPLIFIER HAVING AN ISOLATED PRE-CHARGE ARCHITECTURE, A MEMORY CIRCUIT INCORPORATING SUCH A SENSE AMPLIFIER AND ASSOCIATED METHODS

BACKGROUND

1. Field of the Invention

The embodiments herein relate to sense amplifiers and sensing methods. More particularly, the embodiments relate to a sense amplifier having an isolated pre-charge architecture and an associated method for accurately sensing a value of an input signal (e.g., a value of a bit from a memory cell in a memory circuit, such as a dynamic random access memory (DRAM) cell in a DRAM circuit).

2. Description of the Related Art

Memory circuits, such as dynamic random access memory (DRAM) circuits, typically, incorporate sense amplifiers to sense values of bits (i.e., sensing data bits) stored in individual memory cells in an array. For example, in a DRAM memory cell, a storage capacitor is either charged, thereby storing a data bit of "1", or discharged, thereby storing a data bit of "0". Since such storage capacitors are subject to leakage, the data bit in a DRAM cell must be periodically refreshed. That is, it must undergo periodic read and write-back operations in order to maintain the desired data bit. A sense amplifier is used during the read operation to sense (i.e., read) the value of the stored data bit.

During memory circuit design, trade-offs are made with regard to the sense amplifiers used based on area consumption, power and performance. Generally, maximizing the performance of sense amplifiers or minimizing the power consumed by sense amplifiers comes at the expense of added circuit area and vice versa. As a result of such trade-offs, the sense amplifiers incorporated into many memory circuits are often not sufficiently accurate at high and low voltage/temperature corners.

For example, in the case of a DRAM circuit, high voltage silicon-on-insulator (SOI) DRAM cells suffer from aggravated active retention. Specifically, as a result of various parasitics (e.g., charge sharing, bit line capacitance, etc.), the storage capacitor and the bit line, which transmits the input signal (i.e., a bit) from the storage capacitor to the sense amplifier, will have a tendency to charge and leak. Such charging and leaking degrades the value of the input signal that is received by the sense amplifier during a refresh operation. For example, at a high voltage, a stored data bit of "1" may degrade such that, when it is received by the sense amplifier, it has a value that is less than "1" (i.e., a weak "1"). Similarly, at a high voltage, a stored data bit of "0" may degrade such that, when received by the sense amplifier, the data bit has a value that is greater than "0" (i.e., a weak "0"). Unfortunately, many currently-used sense amplifiers are not capable of accurately sensing the intended value, "1" or "0", of degraded input signals.

Therefore, there is a need in the art for a sense amplifier that can be incorporated into a memory circuit, such as a high voltage dynamic random access memory (DRAM) circuit, without causing any significant area and/power penalties and that is capable of accurately sensing the intended value, "1" or "0", of a degraded input signal.

SUMMARY

Disclosed herein are embodiments of a sense-amplifier. The sense amplifier can comprise a pair of cross-coupled inverters. One of the inverters can comprise a first transistor, having a first drain, and a second transistor connected in series with the first transistor and having a second drain. This inverter can further comprise a first node (i.e., an input node), a second node (i.e., a sense node) and switch between the first and second nodes. The first node can receive an input signal and can be connected to the first drain of the first transistor. The second node can be connected to the second drain of the second transistor and the switch (e.g., a voltage-controlled switch, also referred to herein as an isolator, comprising at least an N-type transistor with a reference voltage ($V_{ref}$) controlled gate) can automatically and selectively control the electrical connection between the first node and the second node and, thereby transmission of the input signal, during an input signal read operation.

Specifically, the second node can be pre-chargeable to a high level and can be pre-charged to that high level prior to a read operation. During the read operation, the switch can be non-conductive, when the voltage at the first node is greater than its trip voltage. This ensures that the second node remains at the high level and that the value of the input signal will be read as high. The switch can become conductive, only when the voltage at the first node is at or less than the trip voltage. This allows the second node to be discharged to the same level as the first node and ensures that the value of the input signal will be read as low. Consequently, the switch allows the intended value of the input signal to be accurately sensed by the sense amplifier even when the value is degraded to some extent.

Also disclosed herein are embodiments of a memory circuit (e.g., a dynamic random access memory (DRAM) circuit) that incorporates such a sense amplifier. The memory circuit can comprise a memory cell that stores a bit, a bit line that receives the bit from the memory cell and a sense amplifier, such as that described above, which senses the value of the bit. Again, the sense amplifier can comprise a pair of cross-coupled inverters. One of the inverters can comprise a first transistor, having a first drain, and a second transistor connected in series with the first transistor and having a second drain. This inverter can further comprise a first node (i.e., an input node), a second node (i.e., a sense node) and a switch between the first and second nodes. The first node can be connected to both the bit line and the first drain of the first transistor. The second node can be connected to the second drain of the second transistor and the switch (e.g., a voltage-controlled switch, also referred to herein as an isolator, comprising at least an N-type transistor with a reference voltage ($V_{ref}$) controlled gate) can automatically and selectively control the electrical connection between the first node and the second node and, thereby transmission of the bit, during a bit read operation.

Specifically, the second node can be pre-chargeable to a high level and can be pre-charged to that high level prior to the read operation. During the read operation, the switch can be non-conductive, when the voltage at the first node (i.e., the voltage on the bit line) is greater than its trip voltage. This ensures that the second node remains at the high level and that the value of the bit will be read as high. The switch can become conductive, only when the voltage at the first node (i.e., the voltage at the bit line) is at or less than the trip voltage. This allows the second node to be discharged to the same level as the first node (i.e., the same level as the bit line) and ensures that the value of the bit will be read as low. Consequently, the switch allows the intended value of the bit to be accurately sensed by the sense amplifier even when the value is degraded to some extent.

Also disclosed herein are method embodiments associated with the above-described sense amplifier and memory circuit (e.g., a dynamic random access memory (DRAM) circuit). The method embodiments can comprise providing a sense amplifier or, more particularly, a memory circuit incorporating a sense amplifier, as described in detail above. Prior to a read operation, the second node (i.e., the sense node) of the sense amplifier can be pre-charged to a high level. After this pre-charging process, the read operation can be performed by automatically and selectively controlling the electrical connection between the first and second nodes (i.e., the input and sense nodes). Specifically, the read operation can comprise the following: (1) preventing, by the switch, the electrical connection between the first node and the second node when the voltage at the first node is less than the trip voltage of the switch; and (2) making (i.e., establishing), by the switch, the electrical connection between the first node and the second node only when the voltage at the first node is at or less than the trip voltage of the switch. Preventing the electrical connection ensures that the second node remains at the high level and that the value of the input signal (e.g., the value of a bit on the bit line) will be read as high; whereas making the electrical connection allows the second node to be discharged to the same level as the first node (e.g., the same level as the bit line) and ensures that the value of the input signal (e.g., the value of a bit on the bit line) will be read as low. Consequently, this controlling process allows the intended value of the input signal (e.g., the intended value of the bit) to be accurately sensed even when the value is degraded to some extent.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

Figure 1:
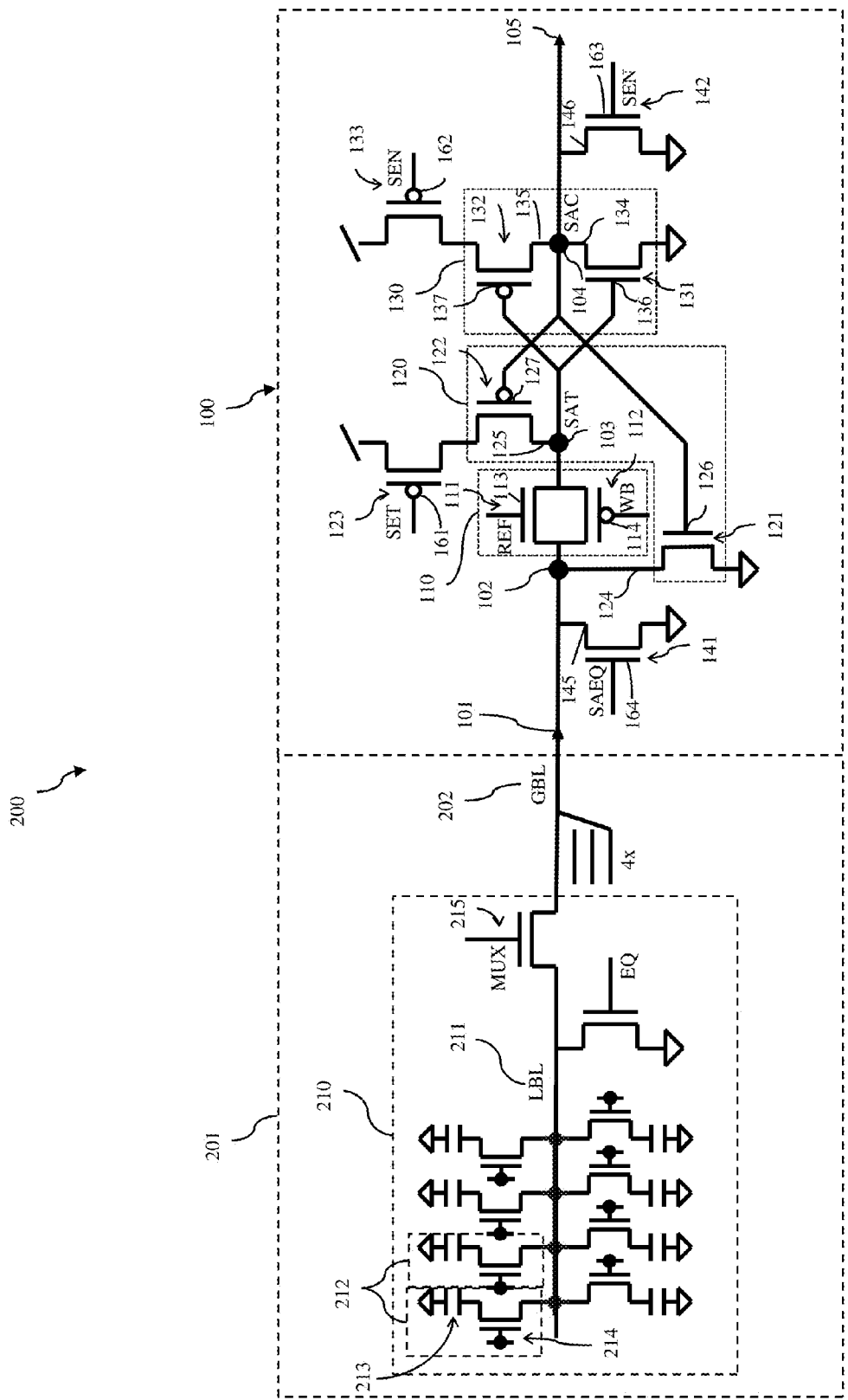
FIG. 1 is a schematic drawing illustrating an embodiment of a sense amplifier and an embodiment of a memory circuit incorporating such a sense amplifier.

The embodiments herein and the various features and advantageous details thereof are explained more fully with reference to the non-limiting embodiments that are illustrated in the accompanying drawings and detailed in the following description.

As discussed above, memory circuits, such as dynamic random access memory (DRAM) circuits, typically incorporate sense amplifiers to sense values of bits (i.e., sensing data bits) stored in individual memory cells in an array. For example, in a DRAM memory cell, a storage capacitor is either charged, thereby storing a data bit of "1", or discharged, thereby storing a data bit of "0". Since such storage capacitors are subject to leakage, the data bit in a DRAM cell must be periodically refreshed. That is, it must undergo periodic read and write-back operations in order to maintain the desired data bit. A sense amplifier is used during the read operation to sense (i.e., read) the value of the stored data bit.

During memory circuit design, trade-offs are made with regard to the sense amplifiers used based on circuit area consumption, power and performance. Generally, maximizing the performance of sense amplifiers or minimizing the power consumed by sense amplifiers comes at the expense of added circuit area and vice versa. As a result of such trade-offs, the sense amplifiers incorporated into many memory circuits are often not sufficiently accurate at high and low voltage/temperature corners.

For example, in the case of a DRAM circuit, high voltage silicon-on-insulator (SOI) DRAM cells suffer from aggravated active retention. Specifically, as a result of various parasitics (e.g., charge sharing, bit line capacitance, etc.), the storage capacitor and the bit line, which transmits the input signal (i.e., a bit) from the storage capacitor to the sense amplifier, will have a tendency to charge and leak. Such charging and leaking degrades the value of the input signal that is received by the sense amplifier during a refresh operation. For example, at a high voltage, a stored data bit of "1" may degrade such that, when it is received by the sense amplifier, it has a value that is less than "1" (i.e., a weak "1"). Similarly, at a high voltage, a stored data bit of "0" may degrade such that, when the sense amplifier receives the data bit, the data bit has a value that is greater than "0" (i.e., a weak "0"). Unfortunately, many currently-used sense amplifiers are not capable of accurately sensing the intended value, "1" or "0", of degraded input signals. One technique for mitigating input signal degradation is to regulate the bit line voltage levels. However, mitigating bit line voltage regulations can overtax the voltage regulators or require additional voltage regulators, which will necessarily result in an area penalty. Furthermore, increased noise resulting from increased voltage regulation operations can further add to input signal degradation.

In view of the forgoing, disclosed herein are embodiments of a sense amplifier, having an isolated pre-charge architecture, and an associated sensing method. Such a sense amplifier can be incorporated into a memory circuit, such as a high voltage dynamic random access memory (DRAM) circuit, in order to accurately sense (i.e., read) a degraded stored data bit (i.e., in order to improve performance) without causing any significant area penalties (i.e., without reducing density) and/or without causing any significant power penalties (i.e., without significantly increasing power requirements). As with prior art sense amplifiers, the disclosed sense amplifier can incorporate a pair of cross-coupled inverters, each comprising a pair of series-connected transistors (e.g., an N-type pull-down transistor can be connected in series to a P-type pull-up transistor). However, unlike prior art sense amplifiers, the electrical connection between the drain nodes in the transistors of one of the inverters and, particularly, between an input node and a sense node, can be automatically and selectively controlled during a read operation by a switch (e.g., a voltage-controlled switch comprising at least an N-type transistor) to allow for an isolated pre-charge and, thereby to provide improved sensing accuracy. Specifically, the drain node of the pull-up transistor can be pre-charged to a high level. During a read operation, the drain node of the pull-down transistor can receive an input signal (e.g., a bit). The voltage-controlled switch can be tripped, thereby making (i.e., establishing) the electrical connection between the drain nodes of the two transistors only when the voltage at the drain node of the pull-down transistor is at or less than the trip voltage associated with the switch. Once the electrical connection is made, the drain node of the pull-up transistor will be discharged to the same level as the input signal (i.e., will be sensed as a "0"). Otherwise, the switch prevents the electrical connection, thereby isolating the pre-charged drain node of the pull-up transistor so that it remains high and is, thereby sensed as a "1". The trip voltage of the switch can be tuned as a function of a reference voltage ($V_{ref}$). Thus, in one embodiment, the reference voltage ($V_{ref}$) can be variable, thereby allowing the sensitivity of the sense amplifier to be selectively adjusted. Also disclosed herein are embodiments of associated methods.

More particularly, referring to FIG. 1, disclosed herein are embodiments of a sense-amplifier 100 and of a memory circuit 200 incorporating such a sense amplifier 100.

The memory circuit 200 can, for example, comprise a dynamic random access memory (DRAM) circuit. This DRAM circuit can comprise, for example, a DRAM array 201 comprising a plurality of local bit lines segments 210. Each local bit line segment 210 can, for example, comprise a plurality of individually addressable DRAM memory cells 212 (e.g., 33 memory cells) and each DRAM memory cell 212 can comprise a storage capacitor 213 connected to a local bit line (LBL) 211 by a transfer gate 214, which is controlled by a word line (not shown). The storage capacitor 213 can be either charged, thereby storing a data bit of "1", or discharged, thereby storing a data bit of "0". The storage capacitor 213 in such a DRAM memory cell 212 can be subject to leakage and, thus, the data bit stored therein must be periodically refreshed. That is, it must undergo periodic read and write-back operations in order to maintain the desired data bit. Such a read operation can comprise the transmission of the stored data bit from the storage capacitor 213 to the local bit line (LBL) 211 via the transfer gate 214, from the local bit line (LBL) 211 to a global bit line (GBL) 202 via a multiplexor 215, and from the global bit line (GBL) 202 to the input of a sense amplifier, such as the sense amplifier 100 discussed below, that is capable of sensing (i.e., reading) the value of the stored data bit. In one embodiment, the DRAM array 201 can comprise multiple sense amplifiers, each of which receives a data input signals from a corresponding global bit line (GBL) 202 that received the data input signal from a selected one of four local bit line segments 210.

This sense amplifier 100 can comprise a pair of cross-coupled inverters (i.e., a first inverter 120 cross-coupled to a second inverter 130). The first inverter 120 can further be coupled at a first node 102 (i.e., an input node) to an input line 202, which receives (i.e., is adapted to receive, is configured to receive, etc.) an input signal 101. For example, in the case of a DRAM circuit 200, the first node 102 can be coupled to a global bit line (GBL)) 202, which receives a stored data bit value from a storage capacitor 213 of a DRAM memory cell 212 in a DRAM memory array 201. The drain 145 of an N-type equalization transistor 141, which is connected in series to ground, can be connected between the input line 202 and the first inverter 120. The second inverter 130 can further be coupled to an output node, which outputs (i.e., is adapted to output, configured to output, etc.) an output signal 105 that is indicative of the input signal 101 (e.g., indicative of the value of the stored data bit). The drain 146 of another N-type equalization transistor 142, which is connected in series to ground, can be connected between the second inverter 130 and the output node.

Each of the inverters 120, 130 in the sense amplifier 100 can comprise a pair of series-connected transistors and, particularly, a first transistor 121, 131 (e.g., an N-type pull-down transistor) connected in series to a second transistor 122, 132 (e.g., a P-type pull-up transistor), respectively. The first transistor 121, 131 can be connected in series to ground and the second transistor 122, 132 can be connected in series by an additional P-type transistor 123, 133 to a positive power supply (e.g., Vdd or voltage bit line high (Vblh)). Unlike prior art sense amplifiers, however, the first inverter 120 in the sense amplifier 100 disclosed herein can further comprise an input node 102, a sense node 103 and a switch 110 (e.g., a voltage-controlled switch, also referred to herein as an isolator) between the nodes 102, 103. This switch 110 can automatically and selectively control (i.e., can be adapted to automatically and selectively control, can be configured to automatically and selectively control, etc.) the electrical connection between the drains 124, 125 of the transistors 121, 122, based on the voltage at the input node 102 (e.g., the voltage on the global bit line (GBL)) in order to provide for pre-charge isolation and, thereby to provide better sensing accuracy).

Specifically, as mentioned above, in the sense amplifier 100, the first inverter 120 can comprise a first transistor 121 (e.g., an N-type pull-down transistor) connected in series to a second transistor 122, having a different conductivity type than the first transistor, (e.g., a P-type pull-up transistor). The first transistor 121 can have a first drain 124 and a first gate 126 and the second transistor 122 can have a second drain 125 and a second gate 127. This first inverter 120 can also comprise the first node 102 (i.e., an input node), the second node (SAT) 103 (i.e., the sense node), and the switch 110 between the first and second nodes 102, 103. The first node 102 can be connected to both the input line 202 (e.g., in the case of a DRAM circuit 200, the global bit line (GBL)) and the first drain 124 of the first transistor 121. The second node (SAT) 103 (i.e., the sense node) can be connected to the second drain 125 of the second transistor 122. Finally, the switch 110 (discussed in greater detail below) can be connected between the first and second nodes 102, 103 (i.e., connected between the input and sense nodes).

The second inverter 130 can similarly comprise a first transistor 131 (e.g., an N-type pull-down transistor) and a second transistor 132 (e.g., a P-type pull-up transistor) connected in series and the first and second transistors 131, 132 can comprise corresponding gates 136, 137 and drains 134, 135. However, the second inverter 130 can be asymmetric with respect to the first inverter 120. Specifically, rather than being separated by a switch, the drains 134, 135 of the first and second transistors 131, 132 of the second inverter 130 can be connected by a single node (i.e., additional node (SAC) 104), which outputs the output signal 105.

In the cross-coupled configuration, the first gate 126 and the second gate 127 of the transistors 121, 122 in the first inverter 120 can be controlled (i.e., are adapted to be controlled, configured to be controlled, wired to be controlled by, etc.) by a control signal from the additional node (SAC) 104, whereas the gates 136, 137 of the transistors 131, 132 of the second inverter 130 can be controlled by (i.e., adapted to be controlled by, configured to be controlled by, wired to be controlled by, etc.) a control signal from the second node (SAT) 103.

The switch 110 between the first node 102 and the second node (SAT) 103 (i.e., between the input and sense nodes) can comprise a voltage-controlled switch (i.e., a voltage sensing switch) comprising at least an N-type transistor 111 with a reference voltage ($V_{ref}$) controlled gate 113. The switch 110 can further have a trip voltage. This trip voltage refers to the voltage at the first node 102 at or below which the switch 110 becomes conductive (i.e., establishes the electrical connection between the nodes 102, 103) and above which the switch 110 remains non-conductive (i.e., prevents the electrical connection between the nodes 102, 103). This trip voltage can be equal to the voltage reference ($V_{ref}$) minus a threshold voltage ($V_t$) of the switch 110. It should be noted that in one embodiment, the voltage reference ($V_{ref}$), which controls the gate 113 can variable so as to allow the trip voltage to be selectively adjusted. Optionally, the switch 110 can further comprise an additional transistor 112 (e.g., a P-type field effect transistor PFET)) connected in parallel to the N-type transistor 111 (i.e., the switch 110 can comprise a P-N pass gate). In the case of a DRAM circuit, the gate 114 of this additional transistor 112 can be controlled, for example, by a write-back signal (WB) (e.g., an external timing signal). Such a switch 110 can automatically and selectively control (i.e., can be adapted to automatically and selectively control, can be configured to automatically and selectively control, etc.) the electrical connection between the first node 102 and the second node (SAT) 103, during an input signal read operation (e.g., in the case of a DRAM circuit, during a bit read operation).

Figure 2:
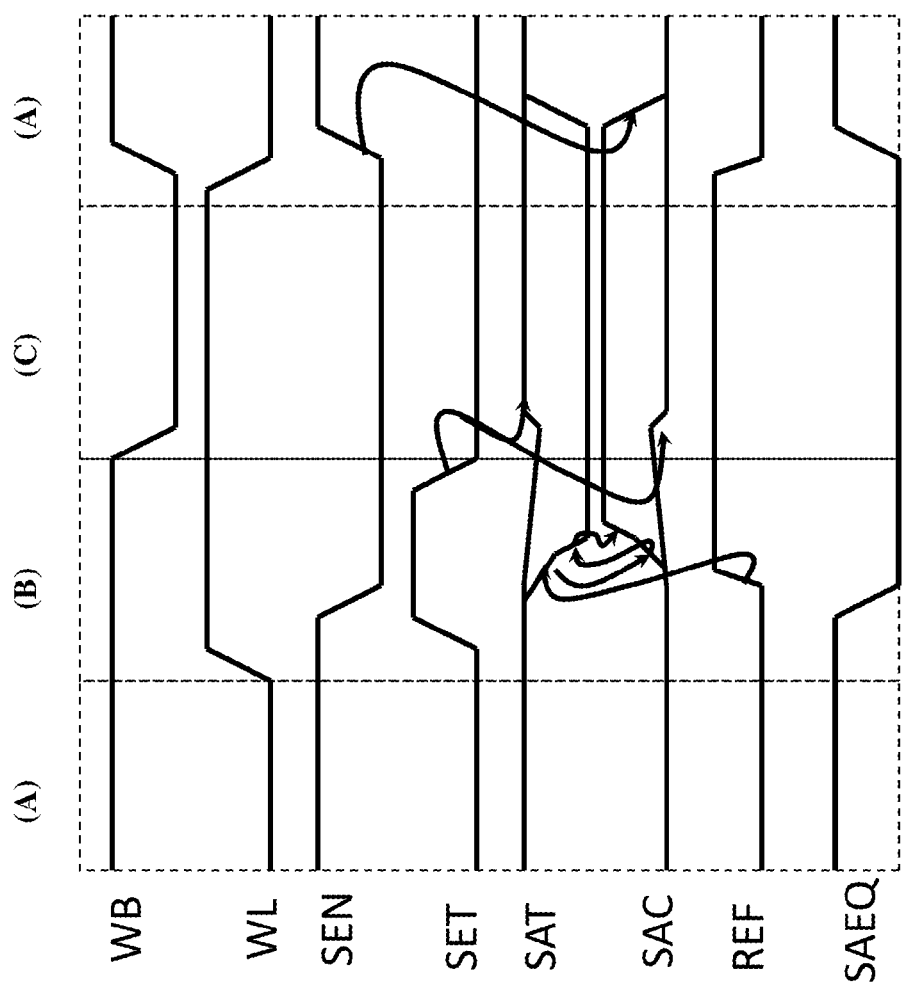
FIG. 2 is a graph illustrating states of the transistors and nodes an exemplary sense amplifier such as that shown in FIG. 1 during a pre-charge operation (A), a read operation (B), and a write-back operation (C)

Specifically, the sense amplifier 100 can perform (i.e., can be adapted to perform, can be configured to perform, etc.) an isolated pre-charge operation, a sensing operation (i.e., read operation) and, in the case of a DRAM circuit, a write-back operation. FIG. 2 is a graph that illustrates the states of the various transistors and nodes of a sense amplifier in a DRAM circuit during a pre-charge operation (A), a read operation (B), and a write-back operation (C).

Referring to FIG. 2 in combination with FIG. 1, during the isolated pre-charge operation (A), the following signals are set low: (1) the word line (WL) that will trigger the subsequent read operation; (2) the SET signal controlling the gate 161 of the additional P-type transistor 123, which connects the P-type pull-up transistor 122 of the first inverter 120 to the positive power supply; and (3) the $V_{ref}$ signal, also referred to herein as REF, controlling the gate 113 of the N-type transistor 111 of the switch 110. Furthermore, the following signals are set high: (1) the SEN signal controlling the gate 162 of the additional P-type transistor 133, which connects the P-type pull-up transistor 132 of the second inverter 130 to the positive power supply, and further controls the gate 163 of the additional equalization transistor 142; (2) the SAEQ signal controlling the gate 164 of the equalization transistor 141; and (3) the write-back (WB) signal controlling the gate 114 of the additional transistor 112 incorporated into the switch 110. Thus, the state of the second node (SAT) 103 (i.e., the sense node) between the first and second transistors 121, 122 of the first inverter 120 will be pre-charged to a high level (e.g., Vdd or Vblh) and the state of the additional node (SAC) 104 between the transistors 131, 132 of the second inverter 130 will remain low (i.e., be pre-charged to ground).

During the read operation (B), a signal from the word line (WL) that will trigger the read operation is set high and the write-back (WB) signal controlling the gate 114 of the additional transistor 112 incorporated into the switch 110 remains high. The $V_{ref}$ signal to the gate 113 of the N-type transistor 111 of the switch 110 is activated (i.e., also set high), but on a delay. Furthermore, the following signals are set low: (1) the SEN signal controlling the gate 162 of the additional P-type transistor 133, which connects the P-type pull-up transistor 132 of the second inverter 130 to the positive power supply, and also controlling the gate 163 of the additional equalization transistors 142; and (2) the SAEQ signal controlling the gate 164 of the equalization transistor 141. This transfers the charge (i.e., the data bit, which in this case is the input signal 101) from the storage capacitor 213 of a memory cell 212 to the local bit line (LBL) 211 and then, via the multiplexor 215 to the global bit line (GBL) 202 and first node 102 (i.e., the input node). In this case, the second node (SAT) 103 and additional node (SAC) 104 float and their respective states will vary as a function of the conductivity of the switch 110.

Thus, the switch 110 can be configured so that, during the read operation, it is non-conductive (i.e., can be adapted to remain non-conductive, can be configured to remain non-conductive, etc.), when the voltage on the input line 202 at the first node 102 is greater than its trip voltage. This ensures that the electrical connection is not made and, thereby that the second node 103 (i.e., the sense node) will remain at the high level and that the value of the input signal 101 at the first node 102 will be read as high.

For example, in the case of a DRAM circuit 200, the switch 110 can be configured so that, during the read operation, it remains non-conductive, when the voltage on the global bit line (GBL) 202 at the first node 102 is greater than its trip voltage. This ensures that the value of a stored data bit from a storage capacitor 213 of a DRAM memory cell 212 in a DRAM memory array 201 will be read as a "1" data bit. Specifically, in the event of a stored charge of "1" in a memory cell 212, the memory cell 212 transfers the charge to the local bit line (LBL) 211 and then the global bit line (GBL) 202 through the multiplexor 215 and, as long as the global bit line (GBL) 202 reaches a voltage above the voltage reference ($V_{ref}$) plus the threshold voltage (Vt) of the switch 110, no current will flow through the switch 110. Thus, the second node (SAT) 103 will remain high and the value of the stored data bit will be read high (i.e., will be read as a "1" data bit), even when the global bit line (GBL) 202 has not reached a full high level. It should be noted that the delay in transitioning $V_{ref}$ from low to high, during the read operation, allows for signal development on the global bit line (GBL) 202 before the switch 110 is activated. Otherwise a slow "1" might falsely discharge the second node (SAT) 103 and, thereby be read as a "0". Additionally, it should be noted that the SET controlled PFET 123 of the first inverter 120 re-enforces the "1" level. Furthermore, incorporation of the write-back signal (WB)-controlled additional PFET transistor 112 into the switch 110 ensures that the switch 110 conducts a full high level and is delayed to establish a strong SAT level on the SAT node 103 of the first inverter 120.

The switch 110 can further be configured so that, during the read operation, it becomes conductive (i.e., can be adapted to become conductive, can be configured to become conductive, etc.) only when the voltage on the input line 202 at the first node 102 is at or less than the trip voltage. This ensures that the electrical connection is made, thereby causing the second node (SAT) 103 to be discharged to the same voltage level as the first node 102. Thus, the value of the input signal 101 will be read as low.

For example, in the case of a DRAM circuit 200, the switch 110 can further be configured so that, during the read operation, it becomes conductive only when the voltage on the global bit line (GBL) 202 at the first node 102 is at or less than the trip voltage. This ensures that the value of a stored data bit from a storage capacitor 213 of a DRAM memory cell 212 in a DRAM memory array 201 will be read as a "0" data bit. Specifically, in the event of a stored charge of "0" in a memory cell 212, the memory cell 212, local bit line (LBL) 211 and global bit line (GBL) 202 all remain at ground, with a total capacitance of around 18 fF. When the $V_{ref}$ signal to the gate 113 of the N-type transistor 111 of the switch 110 is activated, charge sharing occurs between the second node (SAT) 103 with a capacitance of, for example, 1 fF and the total ground capacitance of, for example, 18 fF, resulting in a greater than 90% transfer ratio, and a near full swing transition on the second node (SAT) 103. Thus, the value of the stored data bit will be read low (i.e., will be read as a "0" data bit). In this case, the feedback NFET 126 in the first inverter 120 re-enforces the "0" level.

Consequently, the switch 110 and, particularly, the trip voltage thereof allows the intended value of the input signal 101 on the input line 202 (e.g., in the case of a DRAM circuit 200, the intended value of a stored data bit from a storage capacitor 213 of a DRAM memory cell 212 in a DRAM memory array 201) to be accurately sensed by the sense amplifier 100 even when the value is degraded to some extent. As mentioned above, in one embodiment, the voltage reference ($V_{ref}$), which controls the gate 113 of the N-type transistor 111 of the switch 110 can be variable so as to allow the trip voltage of the switch 110 to be selectively adjusted. Specifically, by selectively varying the voltage reference ($V_{ref}$) on the gate 113, the trip voltage of the switch 110 can be selectively adjusted. Selectively adjusting the trip voltage of the switch 110 adjusts the sensitivity of the sense amplifier 100 so that, during the read operation, an input signal and, more particularly, a degraded input signal, such as a degraded data bit (e.g., a weak "1" or weak "0"), can be accurately sensed. For example, the trip voltage can be adjusted so as to prevent a degraded high input signal (e.g., a weak "1") from being discharged to the second node (SAT) 103 and, thereby being read as a "0". Additionally or alternatively, other parameters of the sense amplifier 100 can be varied in order to selectively adjust the trip voltage of the switch 110 (e.g., the threshold voltage (Vt) of the switch 110 and/or the threshold voltage (Vt) of the second inverter 130).

Figure 3:
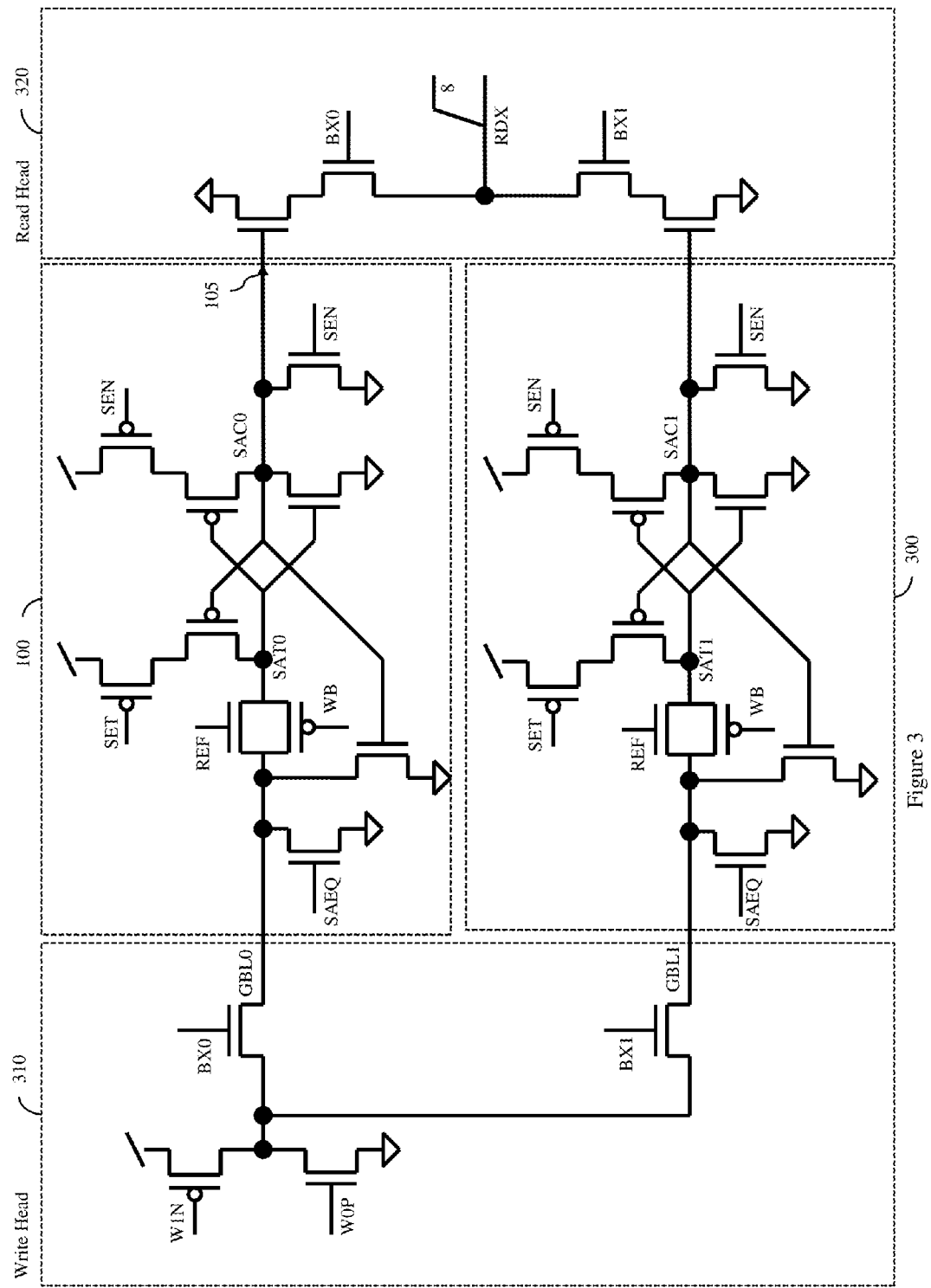
FIG. 3 is a schematic drawing illustrating exemplary read and write-back paths for a memory circuit such as that shown in FIG. 1.

As mentioned above, in a DRAM memory circuit, the stored data bit in a DRAM cell must be periodically refreshed. That is, it must undergo periodic read and write-back operations in order to maintain the desired data bit. Thus, in addition to the read path described above, a DRAM memory circuit 200 requires a corresponding write-back path to allow the write-back operation (C) to be performed. Consequently, referring to FIG. 3, one embodiment of the memory circuit 200 can further comprise an additional sense amplifier 300 configured in essentially the same manner as the sense amplifier 100, described in detail above. The sense amplifiers 100 and 300 can be connected in parallel between a write-head 310 and a read head 320, as shown. That is, sense amplifiers 100, 300 for a read path and a write path, respectively, of the DRAM memory circuit 200 can share a common write-head 310 to enable a direct write, while minimizing GBL load during a masked write. The write-head 310 can comprise a single-ended write head 310, which is decoded with an N-type field effect transistor (WIN). In this case, the value of the data bit can be written to the GBLO by the write head 310 at the beginning of the cycle, resulting in the same cycle time benefits as direct write. As shown in FIG. 2, during the write-back operation (C), the signal from the word line (WL) remains high and the $V_{ref}$ signal initially remains high. Furthermore, the write-back (WB) signal, SEN and SAEQ are set low. Thus, in this case, a complimentary bit-switch is not required, as the additional sense amplifier 300 will provide the high level when SET fires, saving wiring tracks and drivers.

In the case of a DRAM circuit where the above-described write-back operation follows the read operation in order to complete a refresh operation, the location of the switch 110 and, particularly, the location of N-type transistor 111 between the first node 102 and second node (SAT) 103 allows the write-back to "0" to occur more quickly than as seen with prior art DRAM circuits, due to the resulting impedance of the switch 110. Furthermore, when the switch 110 also comprises a P-type transistor 114, having a write-back (WB) signal-controlled gate 112, connected in parallel to the N-type transistor 111, as shown and described above, this P-type transistor can similarly allow the write-back to "1" to a full high level. It should further be noted that the read head 320 can comprise a simple domino read path, which is triggered by the fast "0" transition. This is the opposite of the read "1" in prior art DRAM circuits and leverages the faster read "0" performance.

Figure 4:
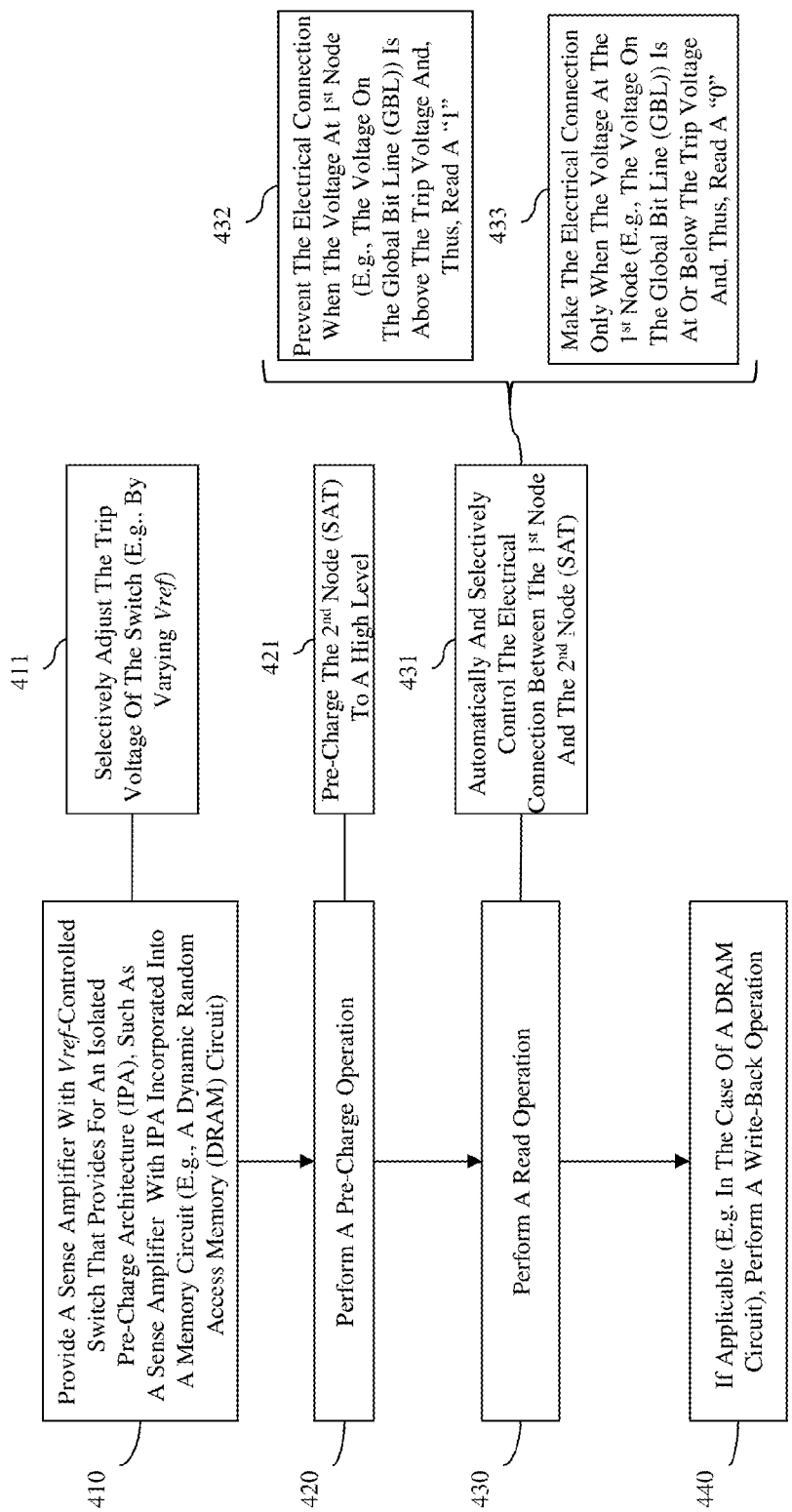
FIG. 4 is a flow diagram illustrating an embodiment of an input signal sensing method.

Also disclosed herein are method embodiments associated with the sense amplifier 100 and memory circuit 200 (e.g., a dynamic random access memory (DRAM) circuit), described in detail above and illustrated in FIG. 1. Specifically, referring to FIG. 4, the method embodiments can comprise providing a sense amplifier 100 for sensing the value of an input signal 101 (410). For example, process 410 can comprise providing a memory circuit 200, such as a dynamic random access memory (DRAM) circuit, that incorporates at least one sense amplifier 100 for sensing the value of a data bit stored in the DRAM memory cell 212.

As discussed in detail above regarding the structure embodiments, the sense amplifier 100 can comprise a switch 110 between the first node 102 (i.e., the input node) and the second node (SAT) 103 (i.e., the sense node) of one of the inverters in a cross-coupled pair of inverters. This switch 110 can comprise a voltage-controlled switch (i.e., a voltage sensing switch) with a reference voltage ($V_{ref}$) controlled gate 113 and a trip voltage. The trip voltage refers to that voltage at the first node 102 at or below which the switch 110 becomes conductive (i.e., establishes the electrical connection between the nodes 102, 103) and above which the switch 110 remains non-conductive (i.e., prevents the electrical connection between the nodes 102, 103). This trip voltage can be equal to the voltage reference ($V_{ref}$) minus a threshold voltage ($V_t$) of the switch 110. Thus, in one embodiment of the method, the voltage reference ($V_{ref}$), which controls the gate 113 of the N-type transistor 111 within the switch, can be selectively varied in order to selectively adjust the trip voltage of the switch 110 (411). Additionally or alternatively, other parameters of the sense amplifier 100 can be varied at process 411 in order to selectively adjust the trip voltage of the switch 110. These other parameters can include, but are not necessarily limited to, the threshold voltage (Vt) of the switch 110 and/or the threshold voltage (Vt) of the second inverter 130). This process 411 of selectively adjusting the trip voltage of the switch 110 can be performed in order to adjust the sensitivity of the sense amplifier 100 so that, during a subsequent read operation, an input signal and, more particularly, a degraded input signal, such as a degraded data bit (e.g., a weak "1" or weak "0"), can be accurately sensed. For example, the trip voltage can be adjusted so as to prevent a degraded high input signal (e.g., a weak "1") from being discharged to the second node (SAT) 103 and, thereby being read as a "0".

The method embodiments can further comprise performing an isolated pre-charging process (420), a read process (430) (i.e., a sensing process) and, if applicable (e.g., in the case of a DRAM circuit), a write-back process (440).

During the isolated pre-charging process 420, the second node (SAT) 103 (i.e., the sense node) of the sense amplifier can be pre-charged to a high level (421). That is, referring to FIG. 2 in combination with FIG. 1, during the isolated pre-charging process (A), the following signals can be set low: (1) the word line (WL) that will trigger the subsequent read operation; (2) the SET signal controlling the gate 161 of the additional P-type transistor 123, which connects the P-type pull-up transistor 122 of the first inverter 120 to the positive power supply; and (3) the $V_{ref}$ signal, also referred to herein as REF, controlling the gate 113 of the N-type transistor 111 of the switch 110. Furthermore, the following signals can be set high: (1) the SEN signal controlling the gate 162 of the additional P-type transistor 133, which connects the P-type pull-up transistor 132 of the second inverter 130 to the positive power supply, and further controlling the gate 163 of the additional equalization transistor 142; and (2) the SAEQ signal controlling the gate 164 of the equalization transistor 141. Thus, the state of the second node (SAT) 103 (i.e., the sense node) between the first and second transistors 121, 122 of the first inverter 120 will be pre-charged to a high level (e.g., Vdd or Vblh) and the state of the additional node (SAC) 104 between the transistors 131, 132 of the second inverter 130 will remain low (i.e., be pre-charged to ground).

After the isolated pre-charging process 420, the read process 430 can be performed (see detailed discussion above in the structure embodiments with regard to the read operation). Specifically, referring again to FIG. 2 in combination with FIG. 1, during this read process 430 a signal from the word line (WL) that will trigger the read operation can be set to high and the $V_{ref}$ signal controlling the gate 113 of the N-type transistor 111 of the switch 110 can be activated (i.e., set high), albeit on a delay. Additionally, the following signals can be set low: (1) the SEN signal controlling the gate 162 of the additional P-type transistor 133, which connects the P-type pull-up transistor 132 of the second inverter 130 to the positive power supply, and further controlling the gate 163 of the additional equalization transistor 142; and (2) the SAEQ signal controlling the gate 164 of the equalization transistor 141. This transfers the charge (i.e., the data bit) in the storage capacitor 213 of a memory cell 212 to the local bit line (LBL) 211 and then, via the multiplexor 215 to the global bit line (GBL), which in the case of a memory circuit is the input line 202 for the sense amplifier 100. In this case, the second node (SAT) 103 and additional node (SAC) 104 are allowed to float. As a result, the respective states of the nodes 103 and 104 will vary as a function of the conductivity of the switch 110 and the read process 430 can further comprise automatically and selectively controlling, by the switch 110, the electrical connection between the first node 102 and second node (SAT) 103 (431).

The process 431 of automatically and selectively controlling the electrical connection between the first node 102 and second node (SAT) 103 can comprise preventing, by the switch 110, the electrical connection when the voltage on the input line 202 at the first node 102 (i.e., at the input node) is greater than its trip voltage (e.g., in the case of a DRAM circuit 200, when the voltage on the global bit line (GBL) 202 at the first node 102 is greater than its trip voltage) (432). This ensures that the second node 103 (i.e., the sense node) will remain at the high level and that the value of the input signal 101 will be read as high (e.g., in the case of a DRAM circuit 200, the value of a stored data bit from a storage capacitor 213 of a DRAM memory cell 212 in a DRAM memory array 201 will be read as a "1" data bit). The process 431 of automatically and selectively controlling the electrical connection between the first node 102 and second node (SAT) 103 can further comprise making (i.e., establishing), by the switch 110, the electrical connection only when the voltage on the input line 202 at the first node 102 is at or less than the trip voltage (e.g., in the case of a DRAM circuit 200, when the voltage on the global bit line (GBL) 202 at the first node 102 is at or less than the trip voltage) (433). This allows the second node 103 to be discharged to the same level as the first node 102 (e.g., to the same voltage level as the global bit line (GBL)). Thus, the value of the input signal 101 will be read as low (e.g., in the case of a DRAM circuit 200, the value of a stored data bit from a storage capacitor 213 of a DRAM memory cell 212 in a DRAM memory array 201 will be read as a "0" data bit), see detailed discussion above with regard to the structure embodiments. Consequently, the process 431 of automatically and selectively controlling the electrical connection between the first node 102 and second node (SAT) 103 allows the intended value of the input signal 101 (e.g., the intended value of a data bit) to be accurately sensed even when the value is degraded to some extent.

In the case of a DRAM circuit, the method can further comprise performing the write-back process 440 to write-back the bit back to the DRAM memory cell and, thereby complete a refresh operation (see the detailed discussion above in the structure embodiments with regard to the write-back operation). Specifically, referring again to FIG. 2 in combination with FIG. 1, during this write-back operation 440, the signal from the word line (WL) can remain high and the $V_{ref}$ signal remains high. Furthermore, the write-back (WB) signal, SEN and SAEQ remain low.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing particular embodiments only and is not intended to be limiting of the embodiments herein. As used herein, the singular forms "a", "an" and "the" are intended to include the plural forms as well, unless the context clearly indicates otherwise. It will be further understood that the terms "comprises", "comprising", "included", and/or "including", when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed.

Finally, it should be understood that the above-description of the embodiments was presented for purposes of illustration and was not intended to be exhaustive or limiting. Many modifications and variations will be apparent to those of ordinary skill in the art without departing from the scope and spirit of the disclosed embodiments.

Therefore, disclosed above are embodiments of a sense amplifier, having an isolated pre-charge architecture, and an associated sensing method. Such a sense amplifier can be incorporated into a memory circuit, such as a high voltage dynamic random access memory (DRAM) circuit, in order to accurately sense (i.e., read) a degraded stored data bit (i.e., in order to improve performance). As with prior art sense amplifiers, the disclosed sense amplifier can incorporate a pair of cross-coupled inverters, each comprising a pair of series-connected transistors (e.g., an N-type pull-down transistor can be connected in series to a P-type pull-up transistor). However, unlike prior art sense amplifiers, the electrical connection between the drain nodes in the transistors of one of the inverters and, particularly, between an input node and a sense node, can be automatically and selectively controlled during a read operation by a switch (e.g., a voltage-controlled switch comprising at least an N-type transistor) to allow for an isolated pre-charge and, thereby to provide improved sensing accuracy.

Specifically, the drain node of the pull-up transistor can be pre-charged to a high level. During a read operation, the drain node of the pull-down transistor can receive an input signal (e.g., a bit). The voltage-controlled switch can be tripped, thereby making (i.e., establishing) the electrical connection between the drain nodes of the two transistors only when the voltage at the drain node of the pull-down transistor is at or less than the trip voltage associated with the switch. Once the electrical connection is made, the drain node of the pull-up transistor will be discharged to the same level as the input signal (i.e., will be sensed as a "0"). Otherwise, the switch prevents the electrical connection, thereby isolating the pre-charged drain node of the pull-up transistor so that it remains high and is, thereby sensed as a "1". The trip voltage of the switch can be tuned as a function of a reference voltage ($V_{ref}$). Thus, in one embodiment, the reference voltage ($V_{ref}$) can be variable, thereby allowing the sensitivity of the sense amplifier to be selectively adjusted. By offering the following these disclosed embodiments achieve high performance (i.e., high sensing accuracy) without significant area and/or power penalties and with minimized bit-line capacitance, which requires regulation for silicon-on-insulator (SW) active retention: (1) improved performance through leveraging of fast N-type transistor read "0" with a Vdd or Vbhl pre-charge; (2) read "1" isolation, allowing a degraded "1" to be sensed; and (3) zero:one signal margin tuning with an analog voltage level control.

What is claimed is:

1. A sense-amplifier comprising an inverter comprising:
a first transistor comprising a first drain;
a second transistor comprising a second drain;
a first node receiving an input signal and further being directly connected to said first drain;
a second node directly connected to said second drain; and
a switch directly connected to said first node and said second node and selectively controlling an electrical connection between said first node and said second node based on a voltage at said first node relative to a trip voltage, said trip voltage being equal to a voltage reference ($V_{ref}$) minus a threshold voltage ($V_t$) of said switch.

2. The sense-amplifier of claim 1, further comprising a second inverter cross-coupled to said inverter.

3. The sense-amplifier of claim 2,
said first transistor further comprising a first gate,
said second transistor further comprising a second gate,
said second inverter comprising
additional transistors comprising corresponding gates and drains; and
an additional node connecting said drains, and
an output connected to said additional node
said first gate and said second gate being controlled by a control signal from said additional node,
said gates being controlled by an additional control signal from said second node, and
said output outputting an output signal indicative of a value of said input signal.

4. The sense-amplifier of claim 1,
said second node being pre-chargeable to a high level during a read operation,
said switch being non-conductive, during said read operation, when said voltage at said first node is greater than said trip voltage of said switch, so that said second node remains at said high level, and
said switch being conductive, during said reading operation, only when said voltage at said first node is less than said trip voltage, so that said second node is discharged to a same level as said first node.

5. The sense-amplifier of claim 4, said trip voltage ensuring that a degraded value of said input signal is accurately sensed by said sense amplifier.

6. The sense-amplifier of claim 1,
said voltage reference ($V_{ref}$) being variable to allow said trip voltage to be selectively adjusted.

7. The sense-amplifier of claim 6,
said switch comprising a third transistor comprising a third gate controlled by said voltage reference ($V_{ref}$) and a fourth transistor connected in parallel to said third transistor and comprising a fourth gate controlled by a write-back signal, and
said first transistor and said third transistor comprising N-type transistors and said second transistor and said fourth transistor comprising P-type transistors.

8. A memory circuit comprising:
a memory cell storing a bit;
a bit line receiving said bit from said memory cell; and
a sense amplifier sensing a value of said bit on said bit line, said sense amplifier comprising an inverter comprising:
a first transistor comprising a first drain; and
a second transistor comprising a second drain;
a first node directly connected to said bit line and to said first drain;
a second node directly connected to said second drain; and
a switch directly connected to said first node and said second node and selectively controlling an electrical connection between said first node and said second node based on a voltage at said first node relative to a trip voltage, said trip voltage being equal to a voltage reference ($V_{ref}$) minus a threshold voltage ($V_t$) of said switch.

9. The memory circuit of claim 8, said memory cell comprising a dynamic random access memory (DRAM) cell.

10. The memory circuit of claim 8, further comprising a second inverter cross-coupled to said inverter.

11. The memory circuit of claim 10,
said first transistor further comprising a first gate,
said second transistor further comprising a second gate,
said second inverter comprising additional transistors comprising corresponding gates and drains; and an additional node connecting said drains, and an output connected to said additional node said first gate and said second gate being controlled by a control signal from said additional node, said gates being controlled by an additional control signal from said second node, and said output outputting an output signal indicative of said value of said bit.

12. The memory circuit of claim 8, said second node being pre-chargeable to a high level during a reading operation, said switch being non-conductive, during said read operation, when a voltage at said first node is greater than a trip voltage of said switch, so that said second node remains at said high level, and said switch being conductive, during said read operation, only when said voltage at said first node is less than said trip voltage, so that said second node is discharged to a same level as said first node.

13. The memory circuit of claim 12, said trip voltage ensuring that a degraded value of said bit is accurately sensed by said sense amplifier.

14. The memory circuit of claim 12, said trip voltage being equal to a voltage reference ($V_{ref}$) minus a threshold voltage ($V_t$) of said switch.

15. The memory circuit of claim 14, said voltage reference ($V_{ref}$) being variable to allow said trip voltage to be selectively adjusted.

16. The memory circuit of claim 14, said switch comprising a third transistor comprising a third gate controlled by said voltage reference ($V_{ref}$) and a fourth transistor connected in parallel to said third transistor and comprising a fourth gate controlled by a write-back signal, and said first transistor and said third transistor comprising N-type transistors and said second transistor and said fourth transistor comprising P-type transistors.

17. A sensing method comprising:

providing a sense amplifier comprising an inverter comprising:

a first transistor comprising a first drain; and a second transistor comprising a second drain;

a first node receiving an input signal and being directly connected to said first drain;

a second node directly connected to said second drain; and a switch directly connected to said first node and said second node;

pre-charging said second node to a high level; and after said pre-charging, performing a read operation, said performing of said read operation comprising controlling an electrical connection between said first node and said second node and said controlling comprising:

making, by said switch, said electrical connection only when a voltage at said first node is less than a trip voltage of said switch so as to ensure that said second node is discharged to a same level as said first node; and preventing, by said switch, said electrical connection when said voltage at said first node is less than said trip voltage so as to ensure that said second node remains at said high level, said trip voltage being equal to a voltage reference ($V_{ref}$) minus a threshold voltage ($V_t$) of said switch.

18. The method of claim 17, said trip voltage ensuring that a degraded value of a bit is accurately sensed.

19. The method of claim 18, further comprising selectively adjusting said trip voltage by varying said voltage reference ($V_{ref}$).

20. The method of claim 19, said selectively adjusting being performed so that, during said read operation, a degraded input signal is accurately sensed.

* * * * *